United States Patent

Minter et al.

Patent Number: 6,150,070
Date of Patent: Nov. 21, 2000

[54] METHOD OF CREATING OPTIMAL PROFILE IN SINGLE LAYER PHOTORESIST

[75] Inventors: Jason P. Minter; William R. Livesay, both of San Diego, Calif.

[73] Assignee: AlliedSignal Inc., Morristown, N.J.

[21] Appl. No.: 09/270,534

[22] Filed: Mar. 17, 1999

[51] Int. Cl.⁷ ........................................... G03C 5/00
[52] U.S. Cl. ........................... 430/296; 430/312; 430/315; 430/328; 430/942; 430/945; 430/967
[58] Field of Search ..................... 430/296, 312, 430/315, 328, 942, 945, 967

[56] References Cited

U.S. PATENT DOCUMENTS

| | | | |
|---|---|---|---|
| 5,468,595 | 11/1995 | Livesay | 430/296 |
| 5,843,537 | 12/1998 | Kim et al. | 427/504 |

*Primary Examiner*—Christopher G. Young
*Attorney, Agent, or Firm*—Leslie A. Weise

[57] ABSTRACT

A process for forming a photoresist image on a substrate and a process for forming metal contacts on a substrate are described. The process of forming a photoresist image includes depositing a positive working photoresist composition onto a semiconductor substrate to thereby form a photoresist layer having a proximal surface on the substrate and a distal surface spaced from the substrate; imagewise exposing the photoresist layer to actinic radiation and developing said photoresist layer to form a plurality of cavities through the photoresist layer extending to the substrate; overall exposing the remaining photoresist layer portion to sufficient electron beam radiation concentrated within said remaining photoresist layer between the proximal and distal surfaces to render a part of said remaining photoresist layer more soluble than prior to exposure; developing the more soluble part of the remaining photoresist layer to thereby expand the cavities to form notches in said remaining photoresist layer between the proximal and distal surfaces to form a notched photoresist layer; overall exposing the notched photoresist layer to sufficient electron beam radiation concentrated at and above the mid-point of the notches to render the notched photoresist layer above the notches more soluble than prior to exposure; and developing the more soluble part of the notched photoresist layer resulting from the prior step to remove the upper portion of the notched photoresist layer above the midpoint of the notches to thereby form champagne glass-shaped cavities in the photoresist layer. In order to form the champagne glass-shaped metal contacts of the present invention the further steps of depositing a metal into said champagne glass-shaped cavities and removing the remaining photoresist and any metal which is not contact-forming to thereby form metal contacts on the substrate. Microelectronic devices prepared by the same process are also disclosed.

26 Claims, 7 Drawing Sheets

METHOD OF CREATING OPTIMAL PROFILE IN SINGLE LAYER PHOTORESIST

BACKGROUND OF THE INVENTION

1. Field of the Invention

This invention relates generally to semiconductor devices. More specifically, the invention relates to the formation of submicron metal contacts on substrates.

2. Description of the Prior Art

The art of forming images for the production of microelectric devices is well known. In this regard, photoresist compositions are widely used image-forming compositions for microelectronic device manufacturing processes. Generally, in these processes a thin coating of a radiation sensitive photoresist composition is first applied to a substrate material. The coated substrate is then treated to evaporate any solvent in the photoresist composition and to fix the coating onto the substrate. The coated surface of the substrate is next subjected to an imagewise exposure to actinic radiation. This radiation exposure causes a chemical transformation in the exposed areas of the coated surface. Visible light, ultraviolet (UV) light, electron beam and X-ray radiant energy are radiation types commonly used in microlithographic processes. After imagewise exposure, the coated substrate is contacted with a developer solution to dissolve and remove either the radiation-exposed or the unexposed areas of the coated surface of the substrate.

There are two general categories of photoresist compositions—negative working and positive working photoresists. When negative working photoresist compositions are exposed imagewise to radiation, the areas exposed to radiation become less soluble to a developer solution while the unexposed areas of the photoresist coating remain relatively soluble to a developing solution. Thus, treatment of an exposed negative working resist with a developer causes removal of the non-exposed areas of the resist coating thereby uncovering a desired portion of the underlying substrate surface on which the photoresist composition was deposited. When positive working photoresist compositions are exposed imagewise to radiation, those areas exposed to the radiation become more soluble to the developer solution while unexposed areas remain relatively insoluble to the developer solution. Thus, treatment of an exposed positive working photoresist with the developer causes removal of the exposed areas of the resist coating and the creation of a positive image in the photoresist coating. A desired portion of the underlying substrate surface remains uncovered. Positive-working photoresist compositions are currently favored over negative-working resists because the former generally have better resolution capabilities and pattern transfer characteristics.

Imaging processes may be additive or subtractive in nature. Subtractive processes entail an etching away of material using dry plasma, a chemical solution, or an ion beam. In a subtractive process a substrate is coated with a resist and the resist layer is then imagewise exposed to radiation in order to degrade the resist in the exposed area. The resist is next immersed in a solvent, which dissolves away the exposed region, leaving the desired image. The resist layer then acts as a protective mask for the subsequent etching away of the material in the layer to be patterned. Remaining portions of the resist layer are then stripped away in a strong solvent, leaving the desired image. Additive processes are those where material is deposited after the resist has been patterned. In an additive or so called "lift-off" process, a metal is deposited after resist patterning and then the resist is stripped off, leaving metal in the open areas of the resist. In such a process, a substrate is coated with a resist layer which is then exposed and developed to dissolve away the exposed image areas. A metal or other material to be patterned is deposited on top of the resist layer, such that the metal or other material adheres to the substrate in the patterned regions. The resist layer is then removed and the excess metal sheared off leaving only a metal contact attached to the substrate.

One major drawback with the above process, however, occurs when metal contacts having particular shapes are desired. Under a conventional approach, a T-shaped metal contact would require employing multiple layers of photoresist having different solubilities along with many additional steps of processing. The benefits of a champagne glass shape include lower contact resistance due to more metal being located at the top of the contact and a smaller gate width at the champagne glass shaped base where the contact touches underlying metal lines. U.S. Pat. No. 5,468,595, which is incorporated herein by reference, shows an electron beam exposure technique wherein a photoresist is exposed at a controlled level, however, it does not describe a champagne glass configuration.

It would therefore be highly desirable to have a means to provide for a champagne glass-shaped image in a photoresist layer using a single layer of photoresist. As part of a solution to the foregoing problems, a process has been found whereby champagne glass-shaped cavities within a single layer of photoresist can be formed. These champagne glass-shaped cavities may then be filled with metal to form champagne glass-shaped metal contacts.

SUMMARY OF THE INVENTION

The invention provides a process for forming a photoresist image on a substrate which comprises:

a) depositing a photoresist of a determined thickness onto a substrate to thereby form a photoresist layer;

b) imagewise exposing the photoresist layer to radiation and developing said photoresist layer to form a plurality of cavities through the photoresist layer extending to the substrate;

c) overall exposing the remaining photoresist layer portion to sufficient electron beam radiation concentrated within said determined thickness of said remaining photoresist layer to render a part of said remaining photoresist layer more soluble than prior to exposure;

d) developing the more soluble part of the remaining photoresist layer to thereby expand the cavities to form notches in the determined thickness of said remaining photoresist layer;

e) overall exposing the notched photoresist layer to sufficient electron beam radiation concentrated within the notches to render the notched photoresist layer above the electron beam concentration point more soluble than prior to exposure; and f) developing the more soluble part of the notched photoresist layer resulting from step (e) to remove the upper portion of the notched photoresist layer above the electron beam concentration point to thereby form champagne glass-shaped cavities in the photoresist layer.

The invention further provides a process for forming champagne glass-shaped metal contacts on a substrate which comprises:

a) depositing a photoresist of a determined thickness onto a substrate to thereby form a photoresist layer;

b) imagewise exposing the photoresist layer to radiation and developing said photoresist layer to form a plurality of cavities through the photoresist layer extending to the substrate;

c) overall exposing the remaining photoresist layer portion to sufficient electron beam radiation concentrated within said determined thickness of said remaining photoresist layer to render a part of said remaining photoresist layer more soluble than prior to exposure;

d) developing the more soluble part of the remaining photoresist layer to thereby expand the cavities to form notches in the determined thickness of said remaining photoresist layer;

e) overall exposing the notched photoresist layer to sufficient electron beam radiation concentrated within the notches to render the notched photoresist layer above the electron beam concentration point more soluble than prior to exposure; and f) developing the more soluble part of the notched photoresist layer resulting from step (e) to remove the upper portion of the notched photoresist layer above the electron beam concentration point to thereby form champagne glass-shaped cavities in the photoresist layer.

g) depositing a metal into said champagne glass-shaped cavities; and h) removing the remaining photoresist and any metal which is not contact-forming to thereby form metal contacts on the substrate.

The invention also provides a microelectronic device prepared by a process which comprises:

a) depositing a photoresist of a determined thickness onto a substrate to thereby form a photoresist layer;

b) imagewise exposing the photoresist layer to radiation and developing said photoresist layer to form a plurality of cavities through the photoresist layer extending to the substrate;

c) overall exposing the remaining photoresist layer portion to sufficient electron beam radiation concentrated within said determined thickness of said remaining photoresist layer to render a part of said remaining photoresist layer more soluble than prior to exposure;

d) developing the more soluble part of the remaining photoresist layer to thereby expand the cavities to form notches in the determined thickness of said remaining photoresist layer;

e) overall exposing the notched photoresist layer to sufficient electron beam radiation concentrated within the notches to render the notched photoresist layer above the electron beam concentration point more soluble than prior to exposure; and f) developing the more soluble part of the notched photoresist layer resulting from step (e) to remove the upper portion of the notched photoresist layer above the electron beam concentration point to thereby form champagne glass-shaped cavities in the photoresist layer.

g) depositing a metal into said champagne glass-shaped cavities; and h) removing the remaining photoresist and any metal which is not contact-forming to thereby form metal contacts on the substrate.

DETAILED DESCRIPTION OF THE PREFERRED EMBODIMENT

Figure 1:
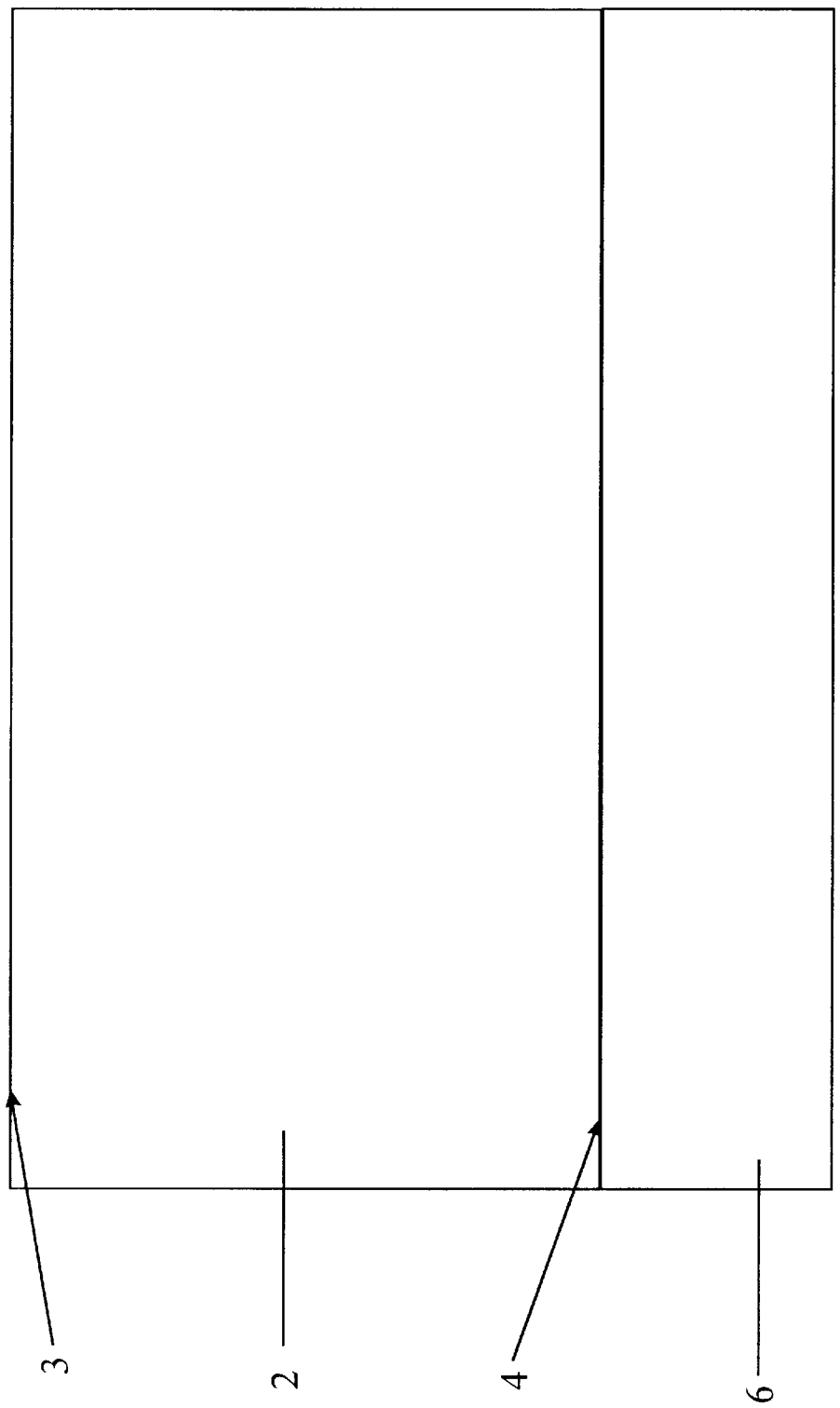
FIG. 1 shows a schematic of the initial layers of photoresist and substrate in relation to each other.

According to the invention, a photoresist image is first formed on a substrate. The substrate is coated with a positive acting photoresist composition to thereby form a photoresist layer having a proximal surface on the substrate and a distal surface spaced from the substrate. The photoresist layer is then imagewise exposed to actinic radiation and developed to form a plurality of cavities through the photoresist layer extending to the substrate. Next, the remaining photoresist layer portion is overall exposed to sufficient electron beam radiation which is concentrated within the remaining photoresist layer between the proximal and distal surfaces to render a part of the remaining photoresist layer more soluble than prior to exposure. The more soluble part of the remaining photoresist layer is then partially developed to thereby expand the cavities to form notches in the remaining photoresist layer between the proximal and distal surfaces to form a notched photoresist layer. The notched photoresist layer is then overall exposed to sufficient electron beam radiation which is concentrated at and above the mid-point of the notches to render the notched photoresist layer above the notches more soluble than prior to exposure. Finally, the more soluble part of the notched photoresist layer resulting from step (e) is developed in order to remove the upper portion of the notched photoresist layer above the midpoint of the notches to thereby form champagne glass-shaped cavities in the photoresist layer.

A process for forming metal contacts is also disclosed as part of the invention. After forming the photoresist image as described above, metal is deposited into the champagne glass-shaped cavities to form metal contacts. Finally, the remaining photoresist and any metal which is not contact-forming is removed such that metal contacts remain on the substrate.

Photoresist compositions are themselves well known in the art and are widely commercially available. Positive working photoresists include compositions or polymers that can be solubilized or degraded as a result of irradiation with an electron beam or actinic radiation. Suitable photoresist compositions may include mixtures of o-quinone diazides with an aqueous alkali soluble or swellable binder resin such as a novolak or poly(4-hydroxystyrene). Suitable photoresists are described in U.S. Pat. Nos. 4,692,398; 4,835,086; 4,863,827 and 4,892,801. Suitable photoresists may be purchased commercially as AZ4620, from Clariant Corporation of Somerville, N.J. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/(poly methyl methacrylate-methacrylic acid). The photoresist of the present invention may comprise any of these materials or analogous materials provided different the composition can be solubilized or degraded as a result of irradiation with an electron beam or actinic radiation.

In a preferred embodiment, the positive working photoresist composition preferably comprises a solution of a novolak resin, a quinone diazide photo sensitizer, and a compatible solvent composition. The production of novolak resins is well known in the art and is more fully described in U.S. Pat. No. 4,692,398. Suitable quinone diazide photosensitizers include o-quinone diazides such as naphthoquinone diazide sensitizers which are conventionally used in the art in positive photoresist formulations. Useful naphthoquinone diazide sensitizers include naphthoquinone-(1,2)-diazide-5-sulfonyl chloride, and naphthoquinone-(1,2)-diazide-4-sulfonyl chloride condensed with compounds such as hydroxy benzophenones. These compounds are also more fully described in U.S. Pat. No. 4,692,398.

To produce this preferred photoresist composition, the resin and diazide components are first mixed together with a suitable solvent. The resin component of this mixture is present in an amount of from about 15% to about 99% of the solid parts mixture, and the quinone is present in an amount of from about 1% to about 85% of the solid parts of the mixture. This resin/diazide mixture is then mixed with a solvent composition. The solvent composition may comprise any suitable solvent known in the art. Preferred solvents include propylene glycol monomethylether, propylene glycol monomethylether acetate, xylene, butyl acetate and Cellosolve acetate such that the solvent comprises from about 40% to about 90% by weight of the overall resist composition. Conventional photoresist additives such as dyes, anti-striation agents, plasticizers, adhesion promoters, speed enhancers and non-ionic surfactants may optionally be added to the photoresist composition before it is deposited onto the substrate.

A second preferred positive working photoresist composition preferably comprises an acrylic polymer such as polymethyl methacrylate (PMMA) and those mentioned above. Polymethyl methacrylate is an acrylic polymer which is extensively used in the industry. Polymethyl methacrylate is known for its clarity, surface hardness, UV resistance and generally good weatherability and chemical resistance. PMMA is commonly used as component of a resist in photolithographic processes for the fabrication of integrated circuits. PMMA is readily commercially available from Aldrich Chemical Company of Milwaukee, Wis.

Suitable developers for novolak resin/diazide photoresist are aqueous alkaline solutions Typical examples of the aqueous alkaline solutions suitable as the developer include sodium hydroxide, tetramethylammonium hydroxide, or aqueous solutions of hydroxides of metals belonging to the groups I and II of the periodic table such as potassium hydroxide or an aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) can be used as the developer. Furthermore, if desired, the aqueous basic solution used as the developer may additionally contain any additives such as a surface active agent in order to improve the resulting development effect. Examples of an aqueous alkaline developer include AZ 400K alkaline developer or AZ 312 MIF alkaline developer available from Clariant Corporation of Somerville, N.J. Suitable developer for acrylate photoresists such as PMMA photoresists include methylisobutyl ketone and xylene.

As shown in FIG. 1 of the present invention, the photoresist composition is deposited onto a suitable substrate 6 to thereby form a photoresist layer 2. Deposition may be conducted via conventional spin-coating, dip coating, roller coating, spraying, chemical vapor deposition methods, or meniscus coating methods which are well-known in the art. Spin coating is most preferred. In a preferred embodiment of the invention, the photoresist layer 2 is formed by centrally applying a liquid photoresist composition to the upper surface of the substrate 6 and then spinning the substrate 6 on a rotating wheel (not shown) at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. This photoresist composition is then dried and/or cured onto the substrate 6 by conventional means such as hotplate softbaking to ultimately form the photoresist layer 2 on the substrate 6. As shown in FIG. 1, the photoresist layer 2 will have a proximal surface 4 and a distal surface 3 spaced from the substrate.

The thickness of the photoresist layer may vary depending on the amount of liquid photoresist composition that is applied by typically the thickness may range from about 500 Å to about 50,000 Å, and preferably from about 2000 Å to about 12,000 Å. The amount of photoresist composition which is applied may vary from about 1 ml to about 10 ml, and preferably from about 2 ml to about 8 ml depending on the size of the substrate.

Typical substrates include those suitable to be processed into an integrated circuit or other microelectronic device. Suitable substrates for the present invention non-exclusively include semiconductor materials such as gallium arsenide (GaAs), germanium, lithium niobate (LiNb$_3$), silicon, and compositions containing silicon such as crystalline silicon, polysilicon, amorphous silicon, epitaxial silicon, and silicon dioxide (SiO$_2$) and mixtures thereof. Lines may optionally be on the substrate surface. The lines, when present, are typically formed by well known lithographic techniques and may be composed of metal, an oxide, a nitride or an oxynitride. Suitable materials for the lines include silicon, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

After deposition onto the substrate 6, the photoresist layer 2 is imagewise exposed, such as through a mask, to actinic radiation. This exposure renders the photoresist layer 2 more soluble after exposure than prior to exposure. The amount of actinic radiation used is an amount sufficient to render the exposed portions of the photoresist layer 2 imagewise soluble in a suitable developer. Actinic radiation such as UV (ultraviolet), laser, writing e-beam, x radiation, etc., may be employed in the present invention. Preferably, UV radiation is used in an amount and at a wavelength sufficient to render the exposed portions of the photoresist layer imagewise soluble in a suitable developer. UV exposure doses of from about 100 mJ/cm$^2$ to about 300 mJ/cm$^2$ are usually sufficient.

Figure 2:
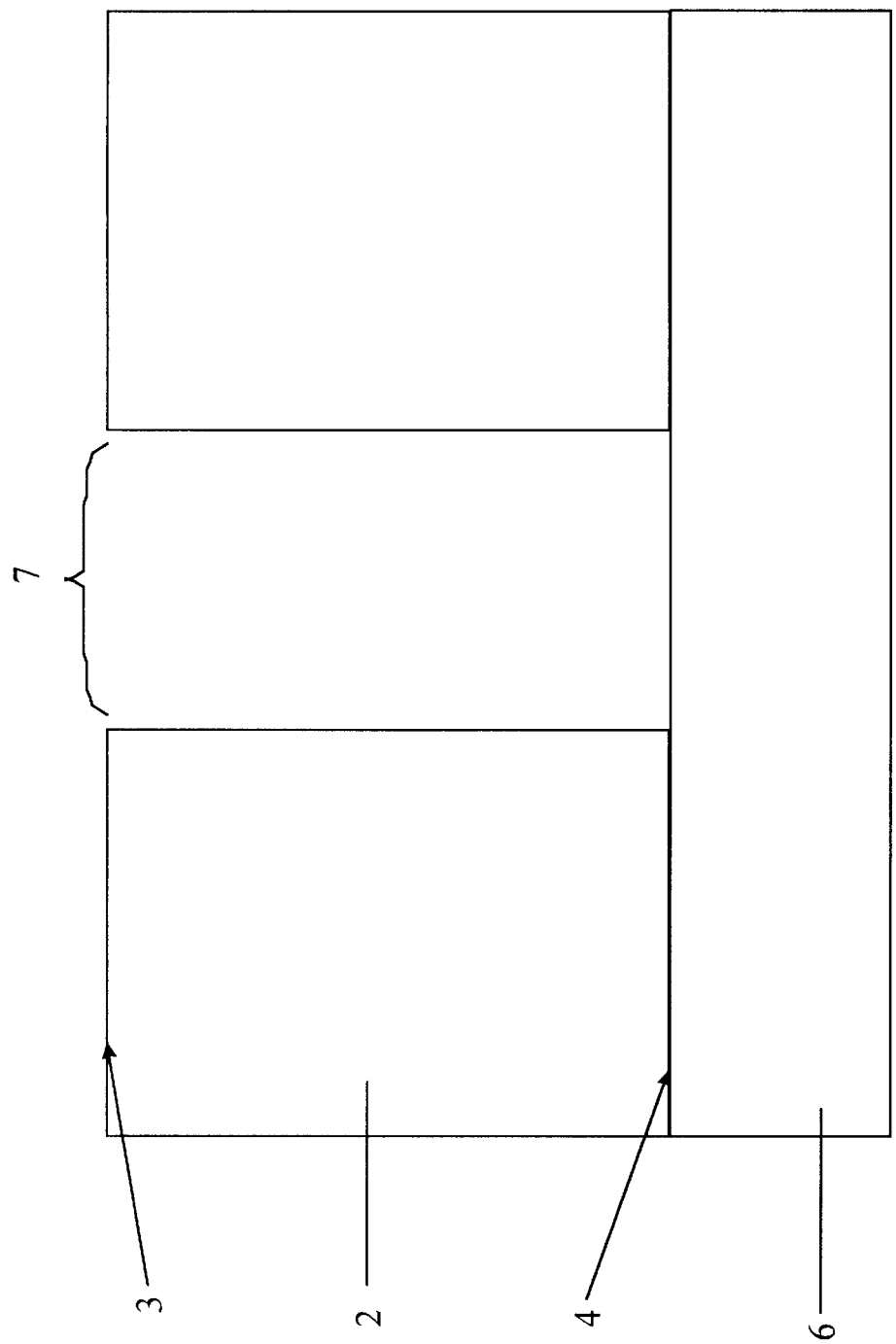
FIG. 2 shows a schematic of the layers of photoresist and substrate in relation to each other after having undergone image exposure to actinic radiation and development.

Once the photoresist layer 2 has been exposed, it is developed under conditions sufficient to form a plurality of cavities (represented by one such cavity 7) as shown in FIG. 2. These cavities 7 preferably extend through the photoresist layer 2 down to the substrate 6.

Figure 3:
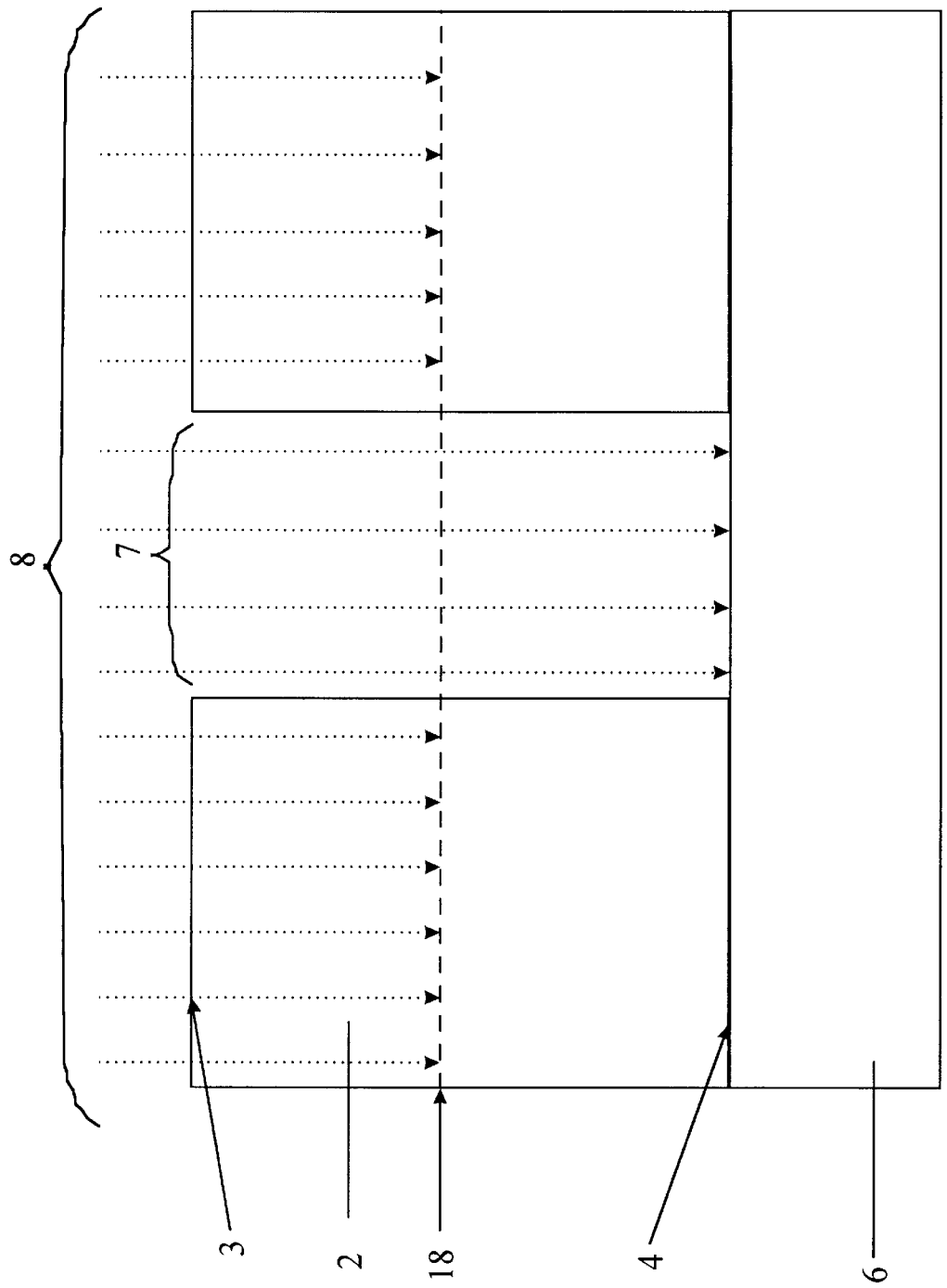
FIG. 3 shows a schematic of an electron beam flood exposure of the photoresist directed between the proximal and distal surfaces.

Turning now to FIG. 3, the remaining photoresist layer 2 portion is then overall exposed to electron beam radiation (represented by arrows 8). The electron beam radiation 8 is concentrated at a plane (represented as line 18) between the proximal surface 4 and the distal surface 3 of the remaining photoresist layer 2 to render a part of the remaining photoresist layer more soluble than prior to exposure. Preferably, line 18 is at about the midpoint of the photoresist thickness. Electron beam exposure may be controlled by setting the beam acceleration. The electron beam radiation 8 is controlled such that the electrons reach are concentrated at a plane (represented as line 18) between the proximal surface 4 and the distal surface 3 of the remaining photoresist layer 2.

Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,001,178, the disclosure of which is incorporated herein by reference. The temperature of the electron beam exposure preferably ranges from about 20° C. to about 450° C., more preferably from about 50° C. to about 400° C. The electron beam energy is preferably from about 1 to about 30 KeV, and more preferably from about 3 to about 10 KeV. The dose of electrons is preferably from about 50 to about 50,000 $\mu$C/cm$^2$, more from about 50 to about 50,000 $\mu$C/cm$^2$ and most preferably from about 50 to about 20,000 $\mu$C/cm$^2$. The gas ambient in the electron beam tool can be any of the following gases: nitrogen, oxygen, hydrogen, argon, helium, ammonia, silane, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches. The end result of the electron beam treatment will be a photoresist layers which has a more soluble area at about the mid-point in the thickness of the remaining photoresist layer. Since the electron beam exposure is not uniform, but rather a Gaussian distribution, exposure is concentrated at line 18 and is of lesser intensity around line 18. Therefore, the photoresist is rendered most soluble at line 18 and less soluble around line 18.

Figure 4:
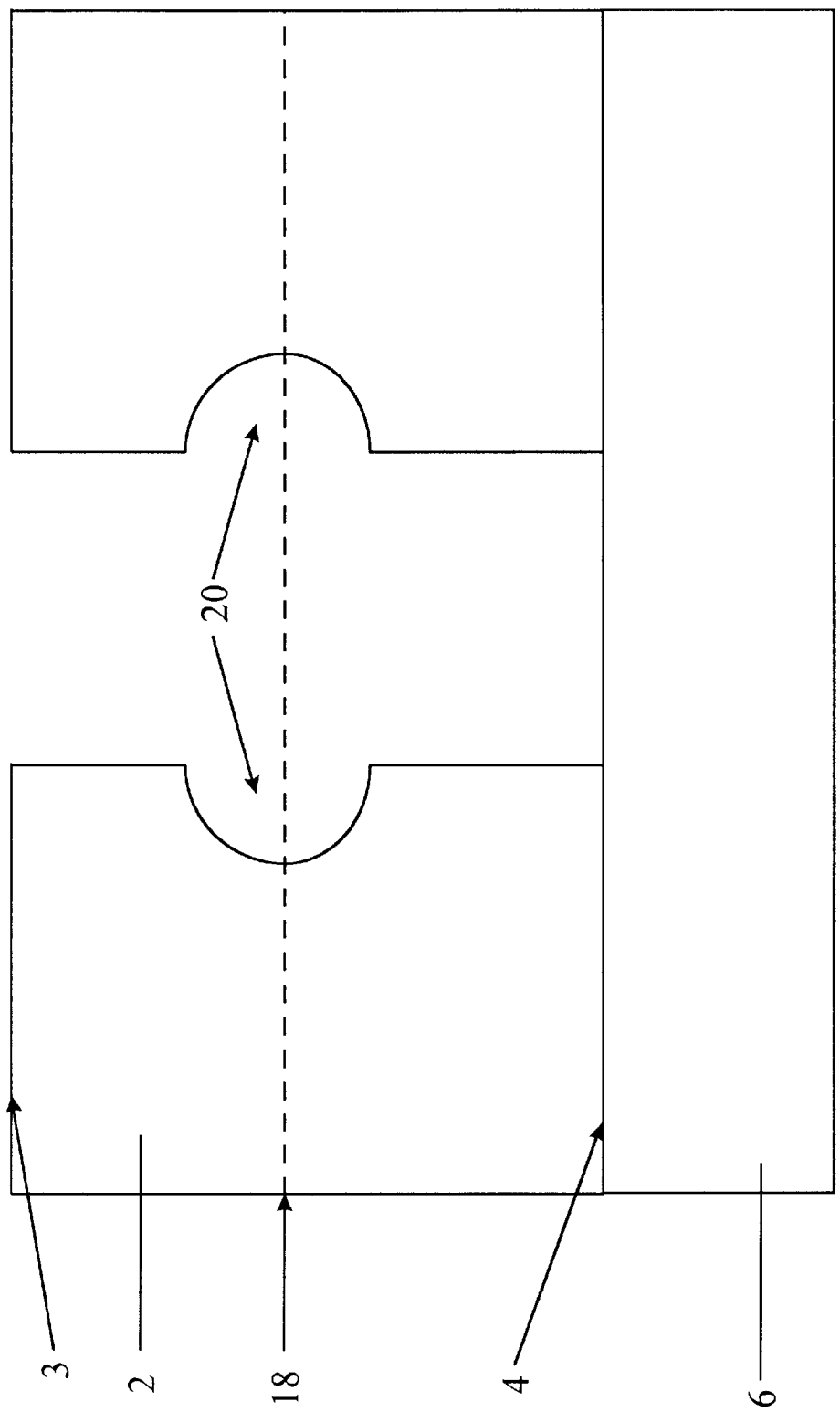
FIG. 4 shows a schematic of a notched photoresist layer and substrate in relation to each other after the more soluble layer has been partially developed.

After election beam exposure, the remaining photoresist layer 2 and its corresponding more soluble area are developed. The development process occurs such that the more soluble area is initially dissolved at the outer, exposed areas. The development continues until notches 20 of a desired dimension are created as shown in FIG. 4. The development procedure may comprise of any conventional method such as immersion in the aforementioned developer and agitation with nitrogen bursts. Once the notches 20 are of the desired dimensions, the development is stopped.

Figure 5:
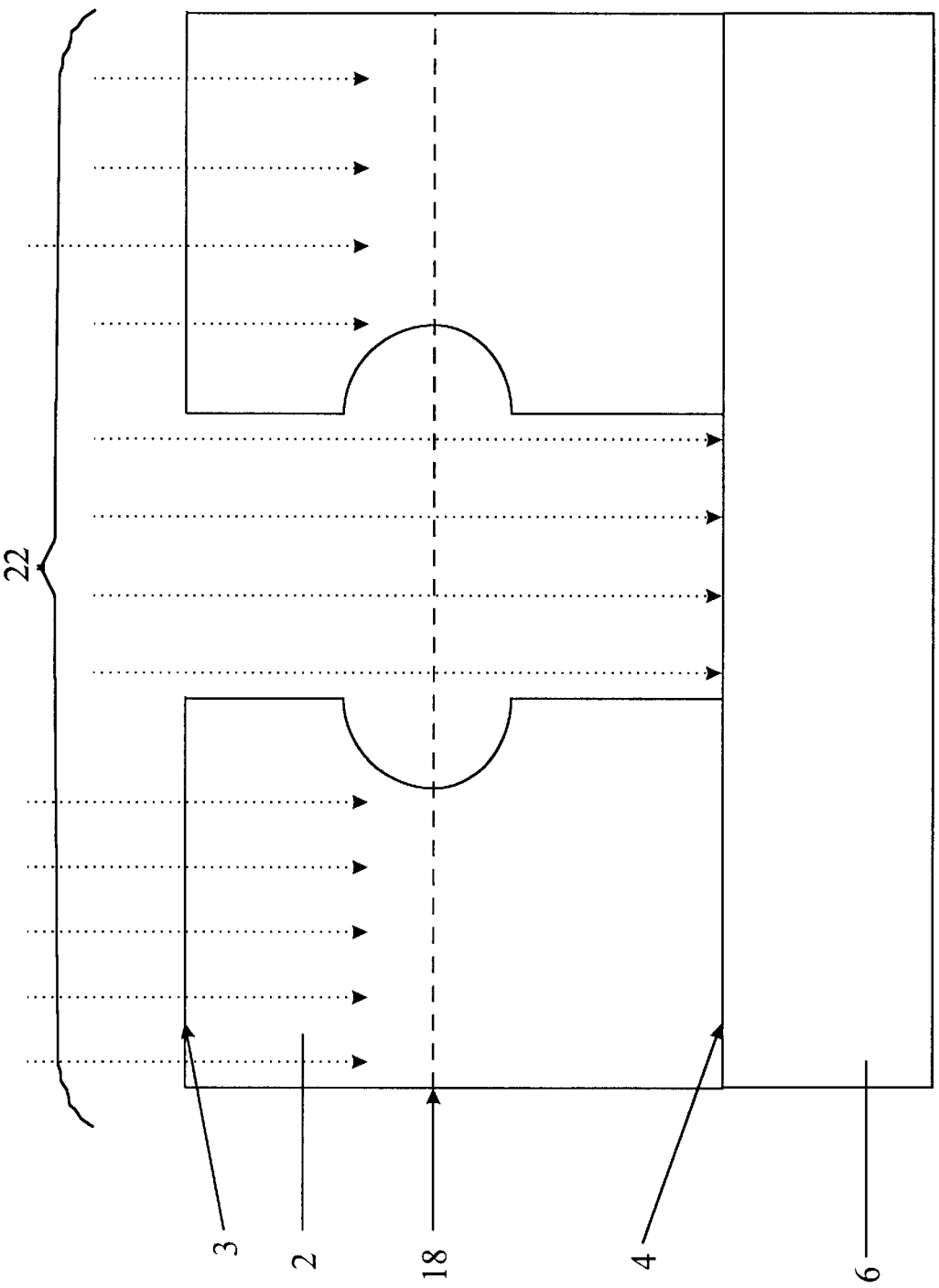
FIG. 5 shows a schematic of an electron beam flood exposure of the notched photoresist layer at and above the midpoint of the notches in the remaining photoresist layer.

Turning now to FIG. 5, the notched photoresist layer 2 is overall exposed to a second electron beam radiation 22 sufficient to render the photoresist layer more soluble in a developer than the balance of the photoresist layer. Electron beam exposure may proceed in a similar or different manner as that described above. What is important, however, is that the radiation is concentrated within the notches to render the notched photoresist layer above the notches more soluble than prior to exposure. That is, the notched photoresist layer located between the distal surface 3 and at or above the midpoint of the notches is exposed to a second electron beam radiation 22. Thus, the upper portion of the photoresist will be more soluble in a developer than the balance of the photoresist layer.

Figure 6:
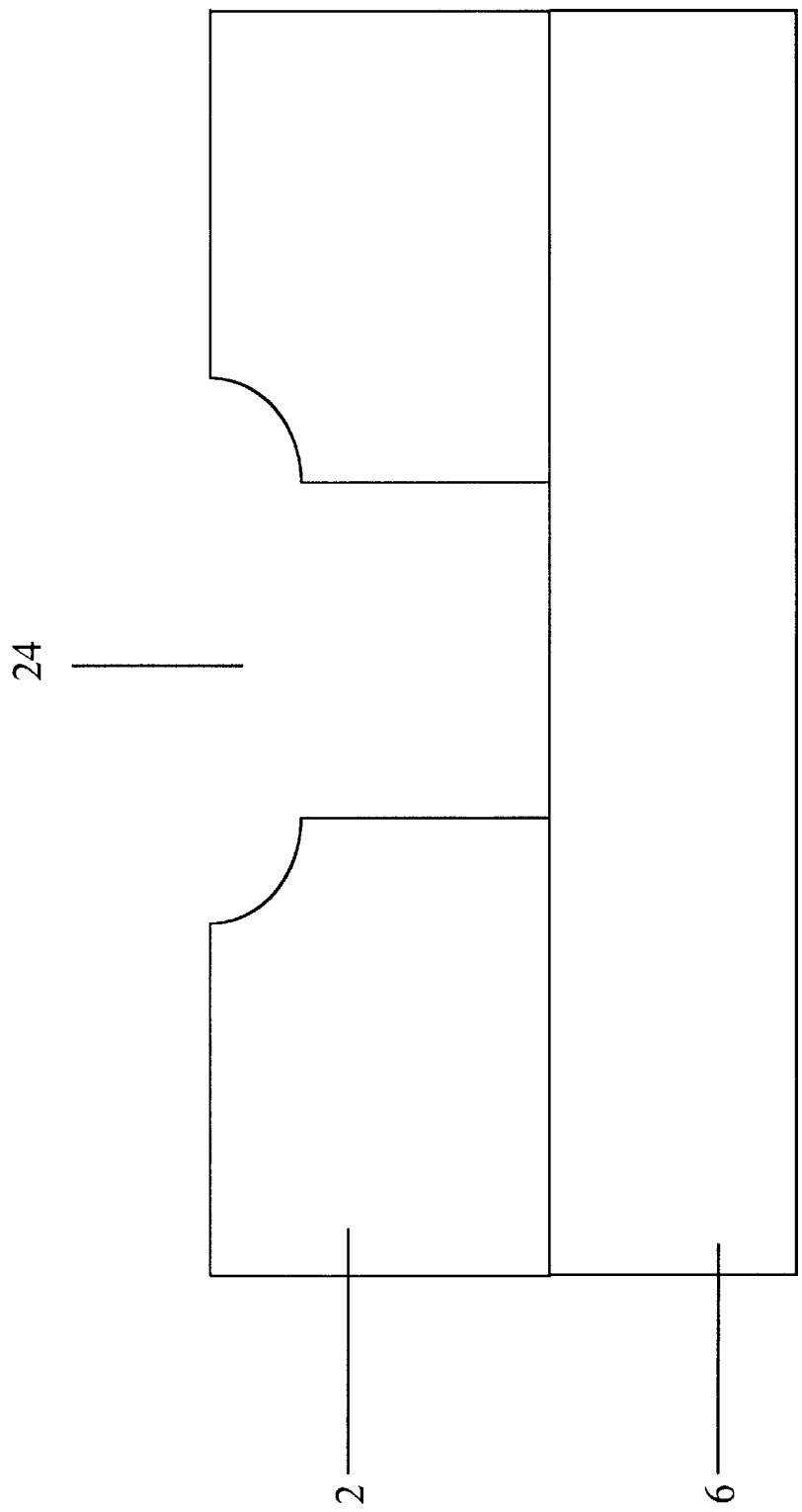
FIG. 6 shows a schematic of a champagne glass-shaped image imbedded in a photoresist layer after the more soluble portion of the photoresist layer has been developed and removed.

After the second electron beam exposure, the more soluble part of the notched photoresist layer 2 undergoes a second development. The development process occurs such that the upper portion of the remaining photoresist is removed. The second development process may proceed in a similar or different manner than the first. What is important, however, is that the more soluble areas of the photoresist layer are removed leaving behind a champagne glass-shaped photoresist image 24 as shown in FIG. 6.

In the formation of metal contacts, metal is deposited into the photoresist layer. As it is applied, the metal fills in the champagne glass-shaped photoresist image 24 within the photoresist layer 2. Suitable metals include aluminum, aluminum alloys, copper, copper alloys, tantalum, tungsten, titanium or other metal typically employed in the formation of microelectronic devices. The metal may be applied by such techniques as vapor deposition, sputtering, evaporation and the like. The thickness of the metal layers is preferably from about 3000 to 5000 Angstroms.

Figure 7:
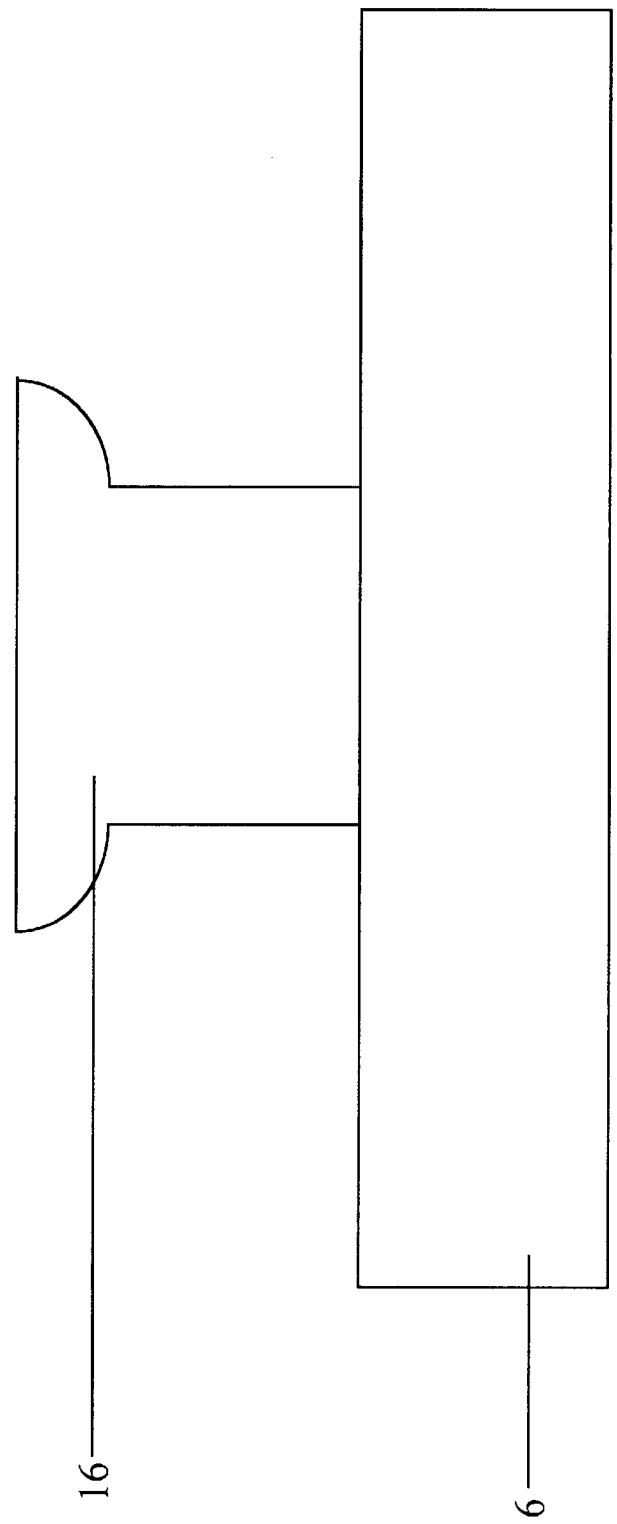
FIG. 7 shows a champagne glass-shaped metal contact after the champagne glass-shaped image area in the photoresist layer has been filled with metal and the remaining photoresist removed.

The remaining photoresist and any metal which is not contact-forming is removed. This step is accomplished using techniques well known in the art. One technique includes stripping or lifting off the metal from the top photoresist surface. This technique may be carried out by soaking the entire assembly in a solvent such as acetone resulting in the ability to shear off the balance of the metal layer on top of the photoresist in addition to simultaneously dissolving away the photoresist layer. Once the remaining photoresist is removed, there appears champagne glass-shaped metal contacts 16 as shown in FIG. 7. The configuration of FIGS. 6–7 is obtained when the electron beam radiation is concentrated at the midpoint of the notch. However, the electron beam radiation can likewise be concentrated above or below the center point of the notch to achieve a different champagne glass profile, such as one wherein the champagne glass edge curves back toward the center of the cavities for a greater amount of metal fill. Likewise the concentration point can be below the center of the notches so that the metal fill is less. The following non-limiting examples serve to illustrate the invention.

EXAMPLE 1

AZ7209 photoresist was spin coated at 3500 RPM to obtain a film thickness of 9,500 Å. Photoresist softbake was performed at 110° C. for 60 seconds. Photoresist exposure was done on an Oriel contact printer at an exposure dose of 2.0 sec using a dark field mask to produce isolated contact openings ranging in size from 2.0 μm down to 0.5 μm in width across the substrate. The photoresist was developed for 180 seconds in AZ400K diluted 1:4 with DI water at 21° C. to remove the photoresist in the exposed regions. The resulting film stack included a 'contact' type of opening in the photoresist with sidewall angles greater than 85°.

Using the Grun range($R_g$) calculation ($R_g$=(0.046/d) $V_a^{1.75}$ where d=photoresist density) for electrons traveling through photoresist, the acceleration voltage required for electrons to penetrate the top half the full photoresist thickness was determined to be 6.0 keV. The acceleration voltage was calculated to penetrate only the top portion of the photoresist depositing the majority of the charge at the mid-point of the photoresist thickness. Electron beam flood exposure of the photoresist was done on the Electron Cure 30™ using 6.0 keV acceleration voltage at a dose of 55 μC/cm² with an electron beam current of 1 ma. A photoresist development step was performed in AZ400K diluted 1:3 with DI water at 21° C. for 90 seconds to create a 250 Å by 250 Å notch profile at the mid-point of the photoresist thickness.

A second EB flood exposure was performed using a 4 step electron beam exposure recipe targeted to fully expose the top half of the photoresist, or 5,000 Å, above the notch previously created to cause the top portion of the photoresist to become fully soluble in developer. The 4 step recipe used was as follows: 5.7 kev/1 ma/75 μc, 3.4 kev/1ma/11 μc, 2.6 keV/1 ma/8 μc, 1.7 kev/1 ma/8 μc. A final photoresist development step was performed in AZ400K diluted 1:3 with DI water at 21° C. for 120 seconds to remove the top half of the photoresist above the mid-point of the notch previously created resulting in a contact opening with a 'champagne' profile in the photoresist.

EXAMPLE 2

JSR-iX500 photoresist was spin coated at 4500 RPM to obtain a film thickness of 11,500 Å. Photoresist softbake was performed at 110° C. for 90 seconds. Photoresist exposure was done on an ASET Model 900SR i-line stepper with an exposure dose of 500 msec using a dark field mask to produce isolated contact openings ranging in size from 2.0 μm down to 0.5 μm in width across the substrate. The photoresist was developed for 180 seconds in AZ400K diluted 1:4 with DI water at 21° C. to remove the photoresist in the exposed regions. The resulting film stack included a 'contact' type of opening in the photoresist with sidewall angles greater than 85°.

Using the Grun range($R_g$) calculation ($R_g$=(0.046/d) $V_a^{1.75}$ where d=photoresist density) for electrons traveling through photoresist, the acceleration voltage required for electrons to penetrate the top half the full photoresist thickness was determined to be 5.7 keV. The acceleration voltage was calculated to penetrate only the top portion of the photoresist depositing the majority of the charge at the mid-point of the photoresist thickness. EB flood exposure of the photoresist was done on the Electron Cure 30™ using 5.7 keV acceleration voltage at a dose of 40 μC/cm² with an electron beam current of 1 ma. A photoresist development step was performed in AZ400K diluted 1:3 with DI water at 21° C. for 60 seconds to create a 250 Å by 250 Å notch profile at the mid-point of the photoresist thickness.

A second electron beam flood exposure was performed using a 4 step electron beam exposure recipe targeted to fully expose the top half of the photoresist, or 5,000 Å, above the notch previously created to cause the top portion of the photoresist to become fully soluble in developer. The 4 step recipe used was as follows: 5.7 kev/1 ma/75 μc, 3.4 kev/1 ma/11 μc, 2.6 keV/1 ma/8 μc, 1.7 keV/1 ma/8 μc. A final photoresist development 2step was performed in AZ400K diluted 1:3 with DI water at 21° C. for 60 seconds to remove the top half of the photoresist above the mid-point of the notch previously created resulting in a contact opening with a "champagne" profile in the photoresist.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have discussed above, and all equivalents thereto.

What is claimed is:

1. A process for forming a photoresist image on a substrate which comprises:
    a) depositing a photoresist of a determined thickness onto a substrate to thereby form a photoresist layer;
    b) imagewise exposing the photoresist layer to radiation and developing said photoresist layer to form a plurality of cavities through the photoresist layer extending to the substrate;
    c) overall exposing the remaining photoresist layer portion to sufficient electron beam radiation concentrated within said determined thickness of said remaining photoresist layer to render a part of said remaining photoresist layer more soluble than prior to exposure;
    d) developing the more soluble part of the remaining photoresist layer to thereby expand the cavities to form notches in the determined thickness of said remaining photoresist layer;
    e) overall exposing the notched photoresist layer to sufficient electron beam radiation concentrated within the notches to render the notched photoresist layer above the electron beam concentration point more soluble than prior to exposure; and
    f) developing the more soluble part of the notched photoresist layer resulting from step (e) to remove the upper portion of the notched photoresist layer above the electron beam concentration point to thereby form champagne glass-shaped cavities in the photoresist layer.

2. The process of claim 1 wherein the electron beam concentration point is at the midpoint of the notches.

3. The process of claim 1 wherein the electron beam concentration point is above the midpoint of the notches.

4. The process of claim 1 wherein the substrate is a microelectronic device substrate.

5. The process of claim 1 wherein the substrate is a semiconductor material.

6. The process of claim 1 wherein the imagewise exposing is conducted with actinic radiation.

7. The process of claim 6 wherein the actinic radiation comprises ultraviolet, laser, writing e-beam, or x-radiation.

8. The process of claim 1 wherein the photoresist composition comprises polymethylmethacrylate.

9. The process of claim 1 wherein the photoresist composition comprises a mixture of an o-quinone diazide with an aqueous alkali soluble or swellable binder resin.

10. The process of claim 1 wherein the substrate is selected from the group consisting of gallium arsenide (GaAs), germanium, lithium niobate, silicon, and mixtures thereof.

11. The process of claim 1 wherein the electron beam exposing step is conducted at an energy level ranging from about 1 to about 30 KeV.

12. The process of claim 1 wherein the substrate has a metal film layer at a surface adjacent to the photoresist layer.

13. The process of claim 1 wherein the electron beam exposing step is conducted at an electron dose ranging from about 1 to about 50,000 $\mu C/cm^2$.

14. The process of claim 1 wherein the electron beam exposing step is conducted with a wide, large beam of electron beam radiation from a large-area electron beam source.

15. The process of claim 1 wherein the electron beam exposing step is conducted with a wide, large beam of electron beam radiation from a uniform large-area electron beam source which covers an area of from about 4 square inches to about 256 square inches.

16. A process for forming champagne glass-shaped metal contacts on a substrate which comprises:
   a) depositing a photoresist of a determined thickness onto a substrate to thereby form a photoresist layer;
   b) imagewise exposing the photoresist layer to radiation and developing said photoresist layer to form a plurality of cavities through the photoresist layer extending to the substrate;
   c) overall exposing the remaining photoresist layer portion to sufficient electron beam radiation concentrated within said determined thickness of said remaining photoresist layer to render a part of said remaining photoresist layer more soluble than prior to exposure;
   d) developing the more soluble part of the remaining photoresist layer to thereby expand the cavities to form notches in the determined thickness of said remaining photoresist layer;
   e) overall exposing the notched photoresist layer to sufficient electron beam radiation concentrated within the notches to render the notched photoresist layer above the electron beam concentration point more soluble than prior to exposure; and
   f) developing the more soluble part of the notched photoresist layer resulting from step (e) to remove the upper portion of the notched photoresist layer above the electron beam concentration point to thereby form champagne glass-shaped cavities in the photoresist layer.
   g) depositing a metal into said champagne glass-shaped cavities; and
   h) removing the remaining photoresist and any metal which is not contact-forming to thereby form metal contacts on the substrate.

17. The process of claim 16 wherein the photoresist composition comprises polymethylmethacrylate.

18. The process of claim 16 wherein the photoresist composition comprises a mixture of an o-quinone diazide with an aqueous alkali soluble or swellable binder resin.

19. The process of claim 16 wherein the substrate is selected from the group consisting of gallium arsenide (GaAs), germanium, lithium niobate, silicon, and mixtures thereof.

20. The process of claim 16 wherein the electron beam exposing step is conducted at an energy level ranging from about 1 to about 30 KeV.

21. The process of claim 16 wherein the electron beam exposing step is conducted at an electron dose ranging from about 50 to about 50,000 $\mu C/cm^2$.

22. The process of claim 16 wherein the electron beam exposing step is conducted with a wide, large beam of electron beam radiation from a large-area electron beam source.

23. The process of claim 16 wherein the electron beam exposing step is conducted with a wide, large beam of electron beam radiation from a uniform large-area electron beam source which covers an area of from about 4 square inches to about 256 square inches.

24. The process of claim 16 wherein the actinic radiation comprises ultraviolet, laser, writing e-beam, or x-radiation.

25. The process of claim 17, wherein the metal is selected from the group consisting of aluminum, aluminum alloys, copper, copper alloys, tantalum, tungsten and titanium.

26. A microelectronic device prepared by a process which comprises:
   a) depositing a photoresist of a determined thickness onto a substrate to thereby form a photoresist layer;
   b) imagewise exposing the photoresist layer to radiation and developing said photoresist layer to form a plurality of cavities through the photoresist layer extending to the substrate;
   c) overall exposing the remaining photoresist layer portion to sufficient electron beam radiation concentrated within said determined thickness of said remaining photoresist layer to render a part of said remaining photoresist layer more soluble than prior to exposure,
   developing the more soluble part of the remaining photoresist layer to thereby expand the cavities to form notches in the determined thickness of said remaining photoresist layer;
   e) overall exposing the notched photoresist layer to sufficient electron beam radiation concentrated within the notches to render the notched photoresist layer above the electron beam concentration point more soluble than prior to exposure; and
   f) developing the more soluble part of the notched photoresist layer resulting from step (e) to remove the upper portion of the notched photoresist layer above the electron beam concentration point to thereby form champagne glass-shaped cavities in the photoresist layer
   g) depositing a metal into said champagne glass-shaped cavities; and
   h) removing the remaining photoresist and any metal which is not contact-forming to thereby form metal contacts on the substrate.

* * * * *